US008383926B2

(12) United States Patent
Plissonnier et al.

(10) Patent No.: US 8,383,926 B2
(45) Date of Patent: Feb. 26, 2013

(54) THERMOELECTRIC STRUCTURE AND USE OF THE THERMOELECTRIC STRUCTURE TO FORM A TEXTILE STRUCTURE

(75) Inventors: Marc Plissonnier, Eybens (FR); Charles Salvi, Grenoble (FR); Thierry Lanier, Vienne (FR); Denis Coulaux, Caluire (FR)

(73) Assignee: Commissariat a l'Energie Atomique, Paris (FR)

( * ) Notice: Subject to any disclaimer, the term of this patent is extended or adjusted under 35 U.S.C. 154(b) by 957 days.

(21) Appl. No.: 11/727,531

(22) Filed: Mar. 27, 2007

(65) Prior Publication Data

US 2008/0029146 A1 Feb. 7, 2008

(30) Foreign Application Priority Data

Apr. 13, 2006 (FR) .................................. 06 03292

(51) Int. Cl.
*H01L 35/02* (2006.01)
(52) U.S. Cl. ........ 136/224; 136/226; 136/200; 136/238; 136/239; 136/240; 136/242
(58) Field of Classification Search .................. 136/224, 136/226
See application file for complete search history.

(56) References Cited

U.S. PATENT DOCUMENTS

| 3,019,278 A | 1/1962 | Fischer |
| 3,661,653 A | 5/1972 | Purdy et al. |
| 3,923,551 A * | 12/1975 | Purdy ............................. 136/201 |
| 7,205,472 B2 * | 4/2007 | Serras ............................ 136/201 |
| 7,348,285 B2 * | 3/2008 | Dhawan et al. ................ 442/229 |
| 2003/0211797 A1 * | 11/2003 | Hill et al. ........................ 442/205 |
| 2004/0025930 A1 | 2/2004 | Serras |
| 2005/0034485 A1 * | 2/2005 | Klefstad-Sillonville et al. .............................. 66/171 |

FOREIGN PATENT DOCUMENTS

| FR | 2 646 021 A1 | 10/1990 |
| JP | A-10-9969 | 1/1998 |
| JP | A 2003-209297 | 7/2003 |
| WO | WO 02/44676 A1 | 6/2002 |

OTHER PUBLICATIONS

Yamamoto, Naokatsu et al. "Electrical Power Generation from a Knitted Wire Panel Using the Thermoelectric Effect," Electrical Engineering in Japan, vol. 140, No. 1 (2002).
Jan. 4, 2012 Office Action issued in Japanese Patent Application No. 2007-105497 (with English Translation).

\* cited by examiner

*Primary Examiner* — Jennifer Michener
*Assistant Examiner* — Matthew Martin
(74) *Attorney, Agent, or Firm* — Oliff & Berridge, PLC

(57) ABSTRACT

The thermoelectric structure is formed by a network of wires oriented substantially in a weft direction of the structure. It comprises first and second conducting wires of different kinds, interwoven to form cold and hot junctions distributed respectively in a top plane and a bottom plane. The junctions are alternately cold and hot along any one conducting wire. The thermoelectric structure comprises at least one high dielectric wire in the top plane, and at least one low dielectric wire in the bottom plane. The dielectric wires are interwoven with the first and second conducting wires so as to keep the top and bottom planes at a distance from one another.

9 Claims, 1 Drawing Sheet

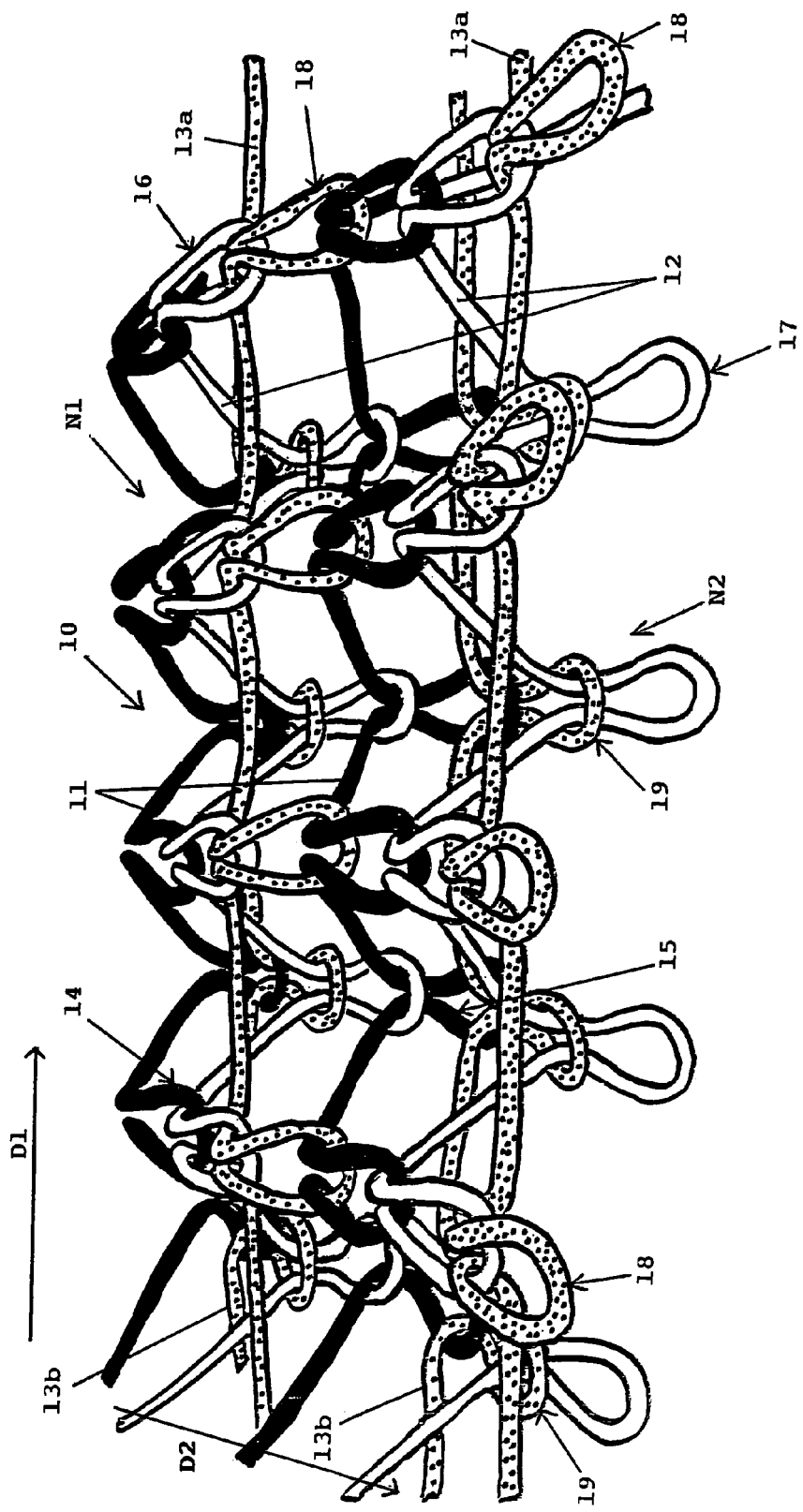

THERMOELECTRIC STRUCTURE AND USE OF THE THERMOELECTRIC STRUCTURE TO FORM A TEXTILE STRUCTURE

BACKGROUND OF THE INVENTION

The invention relates to a thermoelectric structure formed by a network of wires oriented substantially in a weft direction of the structure, comprising first and second conducting wires of different natures that are interwoven to form cold and hot junctions distributed respectively in two planes, a top plane and a bottom plane, the junctions being alternately cold and hot along any one conducting wire.

It also relates to the use of such a thermoelectric structure to form a textile structure.

STATE OF THE ART

This type of thermoelectric structure constitutes a thermoelectric converter enabling for example an electromotive force to be generated by Seebeck effect when a temperature gradient is applied between the cold and hot junctions. In particular, when such a structure is integrated in the material used for making an item of clothing, the temperature gradient that occurs in service between the media separated by said material results in a current production that is able to supply power to electronic systems. Protective clothing integrating navigation systems, sensors or brand infringement protection systems, prostheses providing information on the condition of the joint to be protected, or first aid bandages that measure physical parameters such as heart rate, can thereby be manufactured without integrating a power source, by suitable incorporation of such a thermoelectric structure when manufacturing thereof is performed.

This type of thermoelectric structure also enables a thermal gradient to be developed by Peltier effect when an electric current is applied. In the microelectronics field, this phenomenon can for example serve the purpose of improving the performances and reliability of integrated circuits by performing controlled cooling in real time.

For example, in the article "Electrical power generation from a knitted wire panel using thermoelectric effect" (© 2002 Wiley Periodicals, Inc. Electr Eng Jpn, 140(1): 16-21), N. Yamamoto and H. Takai described a thermoelectric structure constituting a thermoelectric power generator. This structure comes in the form of a knitted wires panel. A flat epoxy resin substrate comprises series of holes aligned in such a way as to form parallel lines. The holes serve the purpose of communication on both sides of the substrate. Alumel (aluminium and nickel alloy) and chromel (chromium and nickel alloy) wires are inserted respectively in adjacent lines of holes. These conducting wires are therefore globally parallel and pass successively from one side of the substrate to the other. On each face of the substrate, each conducting wire forms a loop interwoven with a loop formed in an adjacent conducting wire. More precisely, a conducting wire of one kind is alternately interwoven with two different conducting wires of the other kind, respectively on one side of the substrate and the other. These crossings form alternately cold and hot junctions distributed on two superposed planes. This structure is then transferred onto the corresponding textile structure, for example by sticking.

This type of known thermoelectric structure is not however totally satisfactory. Fabrication of the thermoelectric structure does in fact remain complex and costly, in particular on account of production of the substrate. The applications of such a thermoelectric structure are moreover limited by the flexibility of the substrate which remains low. Integrating the latter in a textile structure when manufacturing a product intended for sale requires additional operations which have the consequence of increasing the production costs of the product. In addition, the thermal gradient (which is an essential factor in the efficiency of the thermoelectric structure) applied to the hot and cold junctions is not optimal, as the textile structure is interposed between the junctions and at least one of the external media covered by the textile structure. For example, when the textile structure equipped with one such thermoelectric structure is applied to fabrication of an item of clothing, the hot junctions and the user's body are separated by a thickness of textile structure, as are the cold junctions and the outside if the thermoelectric structure is disposed between two thicknesses of textile.

OBJECT OF THE INVENTION

The object of the invention is to overcome the above-mentioned shortcomings by proposing a thermoelectric structure whose fabrication is made easier and which provides better flexibility characteristics.

According to the invention, this object is achieved by the fact that the thermoelectric structure comprises at least one high dielectric wire, in the top plane, and at least one low dielectric wire, in the bottom plane, the dielectric wires being interwoven with the first and second conducting wires so as to keep the two top and bottom planes at a distance from one another.

The dielectric wires ensure separation of the conducting wires and ensure that the latter are held in position within the structure so that the conducting wires are interwoven only in the top and bottom planes. The dielectric wires therefore perform a function of insulation of the hot and cold junctions and do away with the necessity of the substrate. The thermoelectric structure can moreover be fabricated in a single structuring operation of the conducting and dielectric wires.

According to a development of the invention, in the direction perpendicular to the weft direction, two adjacent cold junctions are separated and held in position by a top stitch formed by a high dielectric wire, and two adjacent hot junctions are separated and held in position by a bottom stitch formed by a low dielectric wire.

Furthermore, a thermoelectric structure according to the invention can be used to form a textile structure, the dielectric wires then being constituted by textile fibers. Fabrication of a textile structure integrating a thermoelectric structure is therefore greatly facilitated as compared with the prior art, for it is performed in a single operation where the textile fibers and the conducting wires are directly structured together at the same time, for example by knitting. Moreover, the efficiency of the incorporated thermoelectric structure is greatly improved as the temperature gradient applied to the cold and hot junctions corresponds to the temperature gradient between the external media separated by the textile structure.

BRIEF DESCRIPTION OF THE DRAWINGS

Other advantages and features will become more clearly apparent from the following description of a particular embodiment of the invention given as a non-restrictive example only and represented in the single appended drawing schematically representing an example embodiment of a thermoelectric structure according to the invention.

DESCRIPTION OF A PARTICULAR EMBODIMENT

FIG. 1 illustrates a strip of an example embodiment of a thermoelectric structure 10 according to the invention. The thermoelectric structure 10 is achieved in this example by Jacquard knitting. It combines first and second conducting wires 11 and 12 of different natures, respectively represented in black and in white, and high 13a and low 13b dielectric wires made from electrically insulating material and represented by dashed lines. For the knitting, two bobbins of dielectric wires 13a and 13b and two bobbins of conducting wires 11 and 12 of different natures simultaneously feed the needles of a loom adapted for production of the thermoelectric structure 10 which will be described hereafter. The knitting process is well known as such and the method for performing same can easily be determined merely in the light of the structure to be produced. The knitting process will therefore not be described in detail in the scope of the present description.

The conducting wires 11, 12 and the dielectric wires 13a, 13b form a network of substantially parallel interwoven wires which extend substantially in a weft direction D1 of the structure 10. The direction of the structure 10 orthogonal to the weft direction D1 corresponds to the knitting direction called D2. More precisely, the thermoelectric structure 10 is formed by two superposed laps N1, N2, respectively the top lap and the bottom lap, each whereof is formed by rows of stitches oriented in the weft direction D1. The join between the facing surfaces of the two laps N1 and N2 is performed by the conducting wires 11, 12 which themselves form rows of stitches constituting the laps N1, N2 with the associated dielectric wires.

In each lap N1 and N2, each conducting wire 11 forms a row of stitches in the direction D1, respectively referenced 14 and 15, each formed by a U-shaped loop. Likewise for the conducting wires 12, each of the latter forms a row of stitches in each lap, respectively referenced 16, 17 for the laps N1 and N2. In the weft direction D1, each conducting wire 11 alternately forms bottom stitches 15 and top stitches 14, the join between a top stitch 14 and an adjacent bottom stitch 15 constituting the join between the laps N1 and N2. In like manner, in the weft direction D1, each conducting wire 12 alternately forms bottom stitches 17 and top stitches 16, the join between a top stitch 16 and an adjacent bottom stitch 17 constituting the join between the laps N1 and N2.

Each dielectric wire 13a, called high dielectric wire, extends only in the top lap N1, in a direction substantially parallel to the conducting wires 11, 12, and forms a row of top stitches 18 all belonging to the top lap N1. In like manner, each dielectric wire 13b, called low dielectric wire, extends only in the bottom lap N2, in a direction parallel to the conducting wires 11, 12, and forms a row of bottom stitches 19 all belonging to the bottom lap N2.

As represented in the FIGURE, successive rows of stitches are formed in the direction D2. Actually, in the weft direction D1, each first conducting wire 11 is alternately inserted in the top lap N1 in a top stitch 18 formed by a high dielectric wire 13a and in the bottom lap N2 in an adjacent bottom stitch 17 formed by a second conducting wire 12. Starting from each top stitch 18 and bottom stitch 17, the above-mentioned conducting wire 11 itself forms stitches, respectively top 14 and bottom 15. Then, still in the weft direction D1, a low dielectric wire 13b is inserted in the bottom stitches 15 formed by the above-mentioned conducting wire 11 to itself form the bottom stitches 19 of a next bottom row. In the weft direction D1, a second conducting wire 12 is alternately inserted in the top lap N1 in a top stitch 14 formed by the above-mentioned first conducting wire 11, and in the bottom lap N2 in a bottom stitch 19 formed by the previous low dielectric wire 13b. From each top stitch 14 and bottom stitch 19, the conducting wire 12 itself forms stitches, respectively top 16 and bottom 17. Then, still in the weft direction D1, a high dielectric wire 13a is inserted in the top stitches 16 formed by the previous conducting wire 12 to itself form the top stitches 18 of a next top row.

Thus, in this embodiment, two dielectric wires 13a, 13b and two adjacent conducting wires 11, 12 form a generic pattern that is repeated in the direction D2 of the structure. In this generic pattern, the first conducting wire 11 is interwoven, in the weft direction D1, alternately with two different second conducting wires 12, respectively in the next row of the top lap N1 and in the previous row of the bottom lap N2. In like manner, the second conducting wire 12 is interwoven, in the weft direction D1, alternately with two different first conducting wires 11, respectively in the previous row of the top lap N1 and in the next row of the bottom lap N2.

These interweavings constitute alternately cold and hot junctions distributed on two superposed planes materialized by the top lap N1 and the bottom lap N2. Consequently, in the direction D2, two adjacent cold junctions are separated and kept in position by a top stitch 18 formed by a high dielectric wire 13a, and two adjacent hot junctions are separated and kept in position by a bottom stitch 19 formed by a low dielectric wire 13b. The dielectric wires 13a, 13b therefore perform separation of the conducting wires 11 and 12, and also support thereof, as well as holding them in position within the structure 10 such that the conducting wires 11 and 12 are only interwoven in the top and bottom planes. The dielectric wires 13a, 13b thus keep the top and bottom planes at a distance from one another, also performing a function of electrical insulation between the hot junctions and between the cold junctions, and take part in achieving a three-dimensional thermoelectric structure 10. Furthermore, the thermoelectric structure 10 can be produced in a single structuring operation of the conducting wires 11, 12 and dielectric wires 13a, 13b, here by knitting.

The dielectric wires 13a, 13b further give the thermoelectric structure 10 a great flexibility. Any other suitable means for inserting the dielectric wires 13a, 13b in the top and bottom planes can be envisaged, provided that they perform the functions referred to above. For example, the dielectric wires can be arranged in the direction D2. Likewise, the thermoelectric structure 10 can be fabricated with other production methods, such as for example weaving, the form of the interweavings and of the junctions being adapted accordingly.

The alternately cold and hot junctions along any one conducting wire 11, 12 are in series along the same row of stitches. Depending on how the rows of stitches are joined to one another, the junctions constitute thermally paralleled thermocouples which can be electrically in series or parallel.

Advantageously, the dielectric wires 13a 13b can be formed by textile fibers, such as for example cotton, flax, silk, or synthetic textile fibers. The thermoelectric structure 10 is then used to form a three-dimensional textile structure. More precisely, the thermoelectric structure 10 is totally incorporated in the textile structure and participates in structuring thereof. The thermoelectric structure 10 can be arranged over the whole of the textile structure or only over a part thereof. Naturally, the number of conducting wires, and therefore of junctions, their density and material, are chosen according to the final quality of the textile structure in terms of thermoelectricity. As the surface of the thermoelectric structure 10 can be very large, the energy collected can be significant even if the conducting wires 11, 12 do not have high thermoelectric properties.

For example, a knitted prototype corresponding to a belt 1 m in length and 4.5 cm in width comprising 3,366 junctions per face enabled an electric power of 285 μW to be obtained with a voltage of 80 mV when a thermal gradient of 30° C. is applied to the cold and hot junctions.

Finally, the dielectric wires 13a, 13b, by holding and stretching the structure, establish the contacts between the conducting wires 11, 12 to constitute the junctions simply. They can also be welded to one another at the level of the junctions, for example by Joule effect by making a current flow in the conducting wires 11, 12 or by creating an electric arc.

The reaming technique can be used when fabricating the thermoelectric structure 10. The advantage of this technique is to enable knitting to be performed at high speeds without the risk of the conducting wires 11, 12 breaking. Moreover, dissolution or melting of the reaming wire enables dilatation of the structure 10 to be achieved. When the latter is incorporated in a textile structure, this dilatation improves the insulation characteristics of the textile structure thanks to an increase of the density of the wires and the characteristics of the thermoelectric structure by providing electric power to the cold and hot junctions. In this case, the conducting wires 11, 12 do not need to be welded at the level of the junctions.

The invention claimed is:

1. A thermoelectric structure comprising:
   a plurality of first conducting wires of a first nature;
   a plurality of second conducting wires of a second nature distinct from the first nature;
   a plurality of top dielectric wires, each top dielectric wire extending only in a top plane; and
   a plurality of bottom dielectric wires, each bottom dielectric wire extending only in a bottom plane distinct from the top plane;
   the conducting and dielectric wires being oriented substantially in a weft direction of the structure;
   wherein, one of the first conducting wires is interwoven in a set of first top stitches formed by one of the top dielectric wires, and is interwoven in a set of first bottom stitches formed by one of the second conducting wires so as to form hot junctions, two consecutive hot junctions being separated by one of the first top stiches, another second conducting wire is interwoven in a set of second top stitches formed by said one of the first conducting wires so as to form cold junctions, and is interwoven in a set of second bottom stiches formed by one of the bottom dielectric wires, two consecutive cold junctions being separated by one of the second bottom stiches, and wherein the first and second top stiches form the top plane and the first and second bottom stitches form the bottom plane.

2. The structure according to claim 1, wherein the dielectric wires and the conducting wires form a generic pattern that is repeated in a direction of the structure perpendicular to the weft direction.

3. The structure according to claim 1, wherein the thermoelectric structure is produced by Jacquard knitting.

4. The structure according to claim 3, wherein, in a direction perpendicular to the weft direction, two adjacent cold junctions are separated and kept in position by one of the first top stitches, and two adjacent hot junctions are separated and kept in position by one of the second bottom stitches.

5. A method of forming a textile structure utilizing the thermoelectric structure according to claim 1, wherein the dielectric wires are formed by textile fibers.

6. A thermoelectric structure including consecutive woven patterns, each pattern comprising:
   a first conducting wire of a first nature having consecutive loops alternately placed in a top plane and a bottom plane, the top plane and the bottom plane being two distinct planes;
   a second conducting wire of a second nature distinct from the first nature, the second conducting wire having consecutive loops alternately placed in the top plane and the bottom plane, wherein each loop in the top plane of the second conducting wire passes through a respective loop in the top plane of the first conducting wire;
   a first dielectric wire in the bottom plane, the first dielectric wire having consecutive loops with each loop of the first dielectric wire passing through a respective loop in the bottom plane of the first conducting wire; and
   a second dielectric wire in the top plane, the second dielectric wire having consecutive loops with each loop of the second dielectric wire passing through a respective loop in the top plane of the second conducting wire;
   wherein each loop in the bottom plane of the first conducting wire passes through a respective loop in the bottom plane of the second conducting wire of an adjacent pattern, and each loop in the top plane of the first conducting wire passes through a respective loop of the second dielectric wire of the adjacent pattern.

7. The thermoelectric structure according to claim 6, wherein the first and second conducting wires and the first and second dielectric wires are oriented substantially in a weft direction of the structure, each loop in the bottom plane of the second conducting wire passes through a respective loop in the bottom plane of the first dielectric wire, and each pattern is repeated in a direction of the structure perpendicular to the weft direction.

8. The thermoelectric structure according to claim 6, wherein the thermoelectric structure is produced by Jacquard knitting.

9. A method of forming a textile structure utilizing the thermoelectric structure according to claim 6, wherein the dielectric wires are formed by textile fibers.

* * * * *